United States Patent [19]

Levine

[11] Patent Number: 4,488,165

[45] Date of Patent: Dec. 11, 1984

[54] EXTRINSIC INFRARED DETECTOR WITH A CHARGE RESET FUNCTION

[76] Inventor: Michael A. Levine, 383 Sycamore Pl., Sierra Madre, Calif. 91024

[21] Appl. No.: 357,866

[22] Filed: Mar. 15, 1982

Related U.S. Application Data

[63] Continuation-in-part of Ser. No. 333,465, Dec. 22, 1981, Pat. No. 4,433,343.

[51] Int. Cl.³ .................. H01L 27/14; H01L 31/00; H01L 29/78; H01L 29/12
[52] U.S. Cl. ............................. 357/30; 357/24; 357/58
[58] Field of Search ............... 357/30 G, 30 H, 30 J, 357/24 LR, 58

[56] References Cited

U.S. PATENT DOCUMENTS

| | | | |
|---|---|---|---|
| 3,898,685 | 8/1975 | Engeler et al. | 357/24 |
| 4,093,872 | 6/1978 | Hartman et al. | 357/24 X |
| 4,200,892 | 4/1980 | Weimer | 357/30 X |
| 4,228,365 | 10/1980 | Gutierrez et al. | 357/30 X |
| 4,322,638 | 3/1982 | Lee et al. | 357/24 LR |

OTHER PUBLICATIONS

Howes et al., "Charge Coupled Devices & Systems", John Wiley & Sons, pp. 284-295, (1979).
Takahashi et al., "A Monolithic IXIO Array of InGaAsp/InP Photodiodes with Small Dark Current and Uniform Responsivities", IEEE J. Wuantum Electronics, vol. QE-17, No. 2, pp. 239-242, Feb. 1981.
White et al., "A Multiple-Gate CCD-Photodiode Sensor Element for Imaging Arrays", IEEE Trans. on Electron Devices, vol. ED-25, No. 2, pp. 125-131, Feb. 1978.

Primary Examiner—Gene M. Munson
Attorney, Agent, or Firm—John M. May

[57] ABSTRACT

A preferred embodiment of the invention is a three-gate charge-coupled device (CCD) which is designed to operate at cryogenic temperatures (circa 1-20° K). For an N channel device, a low-concentration N type material is separated from a P type substrate by a thin layer of intrinsic material. The active detection area is underneath a transparent detector gate which functions as the device's input gate. Electrons excited into the conduction band under the detector gate flow into the conduction band under the adjoining second gate which functions as an integrating gate by collecting the electrons that flow from under the input gate. The third gate also adjoins the second gate and is called the readout gate. When the readout gate is at a low potential, it dams up the electrons in the conduction band under the integrate gate. When the readout gate is at a potential at least as high as that of the integrate gate, the electrons may flow into a drain which adjoins the readout gate provided that the drain is at a potential higher than that of the readout gate; otherwise, electrons may flow from the drain into the conduction band underneath all three gates if the drain has the lowest potential of the four. Such a device may be constructed as a monolithic two-dimensional array with the drains extending in the Y-direction and the gates extending in the X-direction. Electrons lost by absorption of photons may thus be replaced.

15 Claims, 6 Drawing Figures

EXTRINSIC INFRARED DETECTOR WITH A CHARGE RESET FUNCTION

This is a Continuation-in-Part of a U.S. patent application entitled "Extrinsic Infrared Detector with Dopant Site Charge-Neutralization", filed on Dec. 22, 1981 under Ser. No. 333,465, now U.S. Pat. No. 4,433,343, which is hereby incorporated by reference in its entirety.

TECHNICAL FIELD

The present invention relates generally to semiconductor devices and more particularly to photodetectors intended for use in the infrared region and to monolithic arrays of such detectors.

BACKGROUND OF THE INVENTION

Semiconductor device fabrication techniques for use with a silicon substrate have been under development and in commercial use for many years. It is the existence of this wealth of device technology (whereby metal-oxide-semiconductor (MOS) elements may be fabricated on a silicon substrate so as to have practically any desired electrical characteristic) which has made silicon fundamental to a large class of imaging devices. Furthermore, there are other semiconductor materials in addition to silicon for which imaging devices such as the present invention should find utility—especially as improved fabrication technologies become commercially available for such other semiconductors. Among such other semiconductor materials may be listed, for instance, germanium, indium antimonide and gallium arsenide.

Critical design and fabrication considerations for monolithic arrays of semiconductor infrared photodetectors comprise three areas: (A) Extrinsic Detector Considerations, (B) Cryogenic Considerations and (C) Fabrication Considerations.

A. Extrinsic Detector Considerations

Because of the small energy per photon for infrared light and the unavailability of suitable infrared sensitive materials it is not generally possible to make intrinsic infrared detectors using valence band to conduction band absorptions. Therefore, it has been proposed to construct photocapacitive extrinsic semiconductor infrared detectors on a monolithic semiconductor substrate by doping certain active regions of the semiconductor substrate with impurities having a shallow energy level very close to one of the band edges. Photodetection from these shallow impurities results in the generation of free carriers of one type only. In general, there has been no way provided to replace the excited free carriers lost by the dopant so as to maintain electrical charge neutrality at the dopant sites.

In the prior application titled "Extrinsic Infrared Detector with Dopant Site Charge-Neutralization" of which this application is a Continuation-in-Part, one solution to this problem was disclosed, namely, the use of an external connection from each detector's source to a weakly-conducting impurity band. The external connection provided a path for replacing the carriers which were excited by the incoming radiation. This path was continued throughout the active region by the shallow impurity band itself because the band was at least weakly conducting; the dopant impurities were accordingly close enough together that the carriers in the impurity band could move from one site to another. This moderately close proximity of one dopant site to another causes the impurity band to have a finite energy bandwidth—the width being a function of the dopant concentration. Since the lowest energy level of the impurity band remains at the same level as the original lowest-concentration energy level, an increase in the dopant concentration tends to close the gap between the shallow impurity band and the adjacent band edge of the host material. For small bandgaps the gap may even close entirely making the detector inoperative. Thus, for detectors used in the far infrared where the impurity bandgaps are necessarily very small, practical dopant concentration levels will not necessarily result in sufficient conductivity throughout the active detector region.

Accordingly, there remains a need for an extrinsic detector that functions with dopant concentration levels below what is required for the proper functioning of such an external connection.

The active region of the detector as seen by an incoming photon may be pictured in a semi-classical sense as an array of opaque balls. If the photon hits such a ball, it is absorbed; otherwise it is allowed to progress deeper into the detector. If the total array of all such opaque balls does not appear everywhere opaque to the incoming photon, then there is a certain probability that the photon can pass through the detector without being absorbed (detected). This is described quantitatively as a reduction in the overall quantum efficiency ($\eta$).

Thus, at lower dopant concentrations, the detector must be correspondly thicker or else there will be a reduction of $\eta$. For a background-limited detector wherein the detector noise is generated by the absorption of photons from the background radiation, the detector's signal-to-noise ratio will accordingly be degraded by a factor $\sqrt{\eta}$.

Reductions in quantum efficiency and signal-to-noise ratio are always unwanted and may even result in a device totally unsuitable for its intended purpose. Thus, it is normally desirable to provide a relatively thick detector area.

When $\eta$ is reduced, the light that passes all the way through the detector may be reflected through the detector a second time by the back surface of the substrate thus resulting in degradation of the detector's optical resolution. It is therefore also desirable to provide a mechanism for absorbing any photons which do pass through the detector active area without being absorbed by a dopant site before they can be reflected back.

B. Cryogenic Considerations

Because infrared-sensitive donor impurities have such a small energy gap from the impurity energy level to the conduction band, it is necessary to cool the detector until virtually no electrons are thermally excited into the conduction band so that only electrons excited by incoming infrared light will appear in the conduction band. This cryogenic cooling affects the electrical operation of photocapacitive infrared devices.

In an insulated gate device, such as might be used for a photocapacitive MOS infrared detector, a positive gate voltage (with respect to the substrate) pushes the holes in the weak P-type substrate away from the gate and the oxide. This leaves negatively charged acceptors behind. Since these negatively charged acceptors are uniformly distributed in the substrate, the gate potential decays as the square of the distance from the oxide-semiconductor interface. At high gate voltages, a depletion region is thus formed in the substrate at the oxide interface. Electrons in the conduction band of the semiconductor which are injected into the depletion region are held near the oxide interface where there are no holes with which the electrons can recombine.

The depth of the depletion region varies approximately as the square root of the gate voltage and inversely as the square root of the acceptor concentration. At cryogenic temperatures, (say 1°–20° K.), it is the ionized acceptor concentration which must be used in the calculation. At cryogenic temperatures the ionized acceptor concentration is very small and the depth of the depletion region is many times the depth of the substrate. Hence the depletion region has a virtually linear potential proportional to the gate voltage and running from the front of the substrate at the oxide interface to the back of the substrate at the electrical ground connection as if the entire substrate were an insulator and the entire device a parallel-plate capacitor.

Since the depth of the depletion region in a simple cryogenic MOS device is many times deeper than the P+ channel stops (which are diffused into the substrate at the surface next to the oxide) it is difficult to keep the N channel electrons near the gates.

Thus, it is also desirable to provide a means to keep the N channel electrons in their proper near-the-surface positions and to maintain the effectiveness of the P+ channel stops even under cryogenic conditions. This is especially important for a "surface N channel" CCD (Charge Coupled Device) wherein the electrons are manipulated along the semiconductor surface using multiple gates.

C. Fabrication Considerations

If the active photon-absorbing region is to have a uniformly low concentration of dopant, then diffusion of the dopant is impractical since diffusion tends to leave a high concentration at the surface. If (because of the low dopant concentration) a thick active region must also be formed, then ion-implantation is impractical because the depth of implantation is small (though not necessarily peaked at the surface as with diffusion).

Thus, there is a need for a device having a relatively thick active detector region and a relatively low, but uniform, dopant concentration.

In any monolithic array of photodetectors there are locations where the array has unwanted sensitivity such as between the N+ drain and the P+ channel stop.

Accordingly, it is also desirable to provide a device structure in which such locations may be conveniently masked off by means of conventional fabrication techniques.

D. SPECIFIC OBJECTIVES OF THE INVENTION

Thus, it is a primary object of the present invention to provide a mechanism for replacing the excited free carriers lost by the dopant (or other impurities in the active detection region) so as to maintain electrical charge neutrality at the dopant sites.

It is a more specific object to keep the concentration of impurities at the relatively low levels required for operation in the infrared region and in particular in the far infrared.

It is yet another related objective to maintain the overall quantum efficiency ($\eta$) and signal-to-noise ratio at an acceptable level by providing a relatively thick detector area.

It is yet another object to provide a mechanism for absorbing any photons which do pass through the active detector area before they can be reflected back.

It is yet another object to provide a mechanism for confining the free carriers to defined regions of the device.

It is further related object to keep the carriers near the surface of the device so that they may be manipulated by means of a plurality of gate electrodes.

It is yet another objective of the present invention to provide a detector device that may be conveniently fabricated by means of conventional MOS fabrication techniques.

It is a related object to provide a device whose active detector region may be grown epitaxially together with the required impurities.

It is yet another related object to provide a device that will have a relatively thick active detector region and a relatively low, but uniform, dopant concentration.

It is yet another related object to provide a device in which regions of unwanted sensitivity may be conveniently masked off.

Another object of the invention is to provide an imaging device that may be constructed as a monolithic array of individual picture elements.

A related object is to provide a two-dimensional detector array wherein the individual elements may be sequentially addressed.

Reference to said Continuation-in-Part application should be made for further background information and objectives which may also be relevant to the present invention.

BRIEF SUMMARY OF THE INVENTION

Briefly, the invention which is intended to achieve the above objects, and such other similar and related objects as will become apparent from the appended Detailed Description and the drawings, may be summarized as follows:

A preferred embodiment of the invention is a three-gate charge-coupled device (CCD) which is designed to operate at cryogenic temperatures (circa 1°–20° K.). The device is built up in layers on an underlying substrate with the gates forming a front surface and the substrate a rear surface. For an N channel device, a low-concentration N type material is separated from a P type substrate by a thin layer of intrinsic material. The substrate acts as a rear channel stop which keeps the mobile electrons of the device near to the front surface so that the electrons cannot stray randomly from gate to gate even at cryogenic temperatures.

The active detection area is underneath a transparent detector gate which functions as the device's input gate. Electrons excited into the conduction band under the detector gate flow into the conduction band under the adjoining second gate which functions as an integrating gate by collecting the electrons that flow from under the input gate. The potential of the integrate gate is normally higher than that of the detector gate and, preferably, both remain at fixed potentials. The third gate also adjoins the second gate and is called the readout gate. When the readout gate is at a low potential, it dams up the electrons in the conduction band under the integrate gate. When the readout gate is at a potential at least as high as that of the integrate gate, the electrons may flow into a drain which adjoins the readout gate provided that the drain is at a potential higher than that of the readout gate; otherwise, electrons may flow from the drain into the conduction band underneath all three gates if the drain has the lowest potential of the four. This latter condition is the reset function. Electrons lost by absorption or other processes may thus be replaced at the donor sites which are responsible for the extrinsic impurity band.

Preferably, the integrate and readout gates are opaque; furthermore, the device is cryogenicly cooled. Accordingly, only the region under the detector gate actually requires any appreciable electron replenishment. However, by resetting all three gate regions and by also using opaque masking over any regions of unwanted sensitivity, the entire device area and/or array area may be epitaxially grown with the same low-concentration of extrinsic donor impurities as is required for the active detection area. This greatly facilitates the device and/or array fabrication by permitting a relatively thick epitaxial layer to be grown across the entire device or array of devices.

Operation of such a device may comprise four stages which constitute one cycle (1) fill, (2) spill, (3) integrate, and (4) readout. The fill stage is the reset function wherein the drain is at a low potential thus filling the conduction band regions under the readout, integrate and detector gate regions. During the spill stage, excess fill electrons are drained back into the drain. During the integrate stage, electrons from the detector region are collected under the integrate gate and are prevented by the readout gate from reaching the drain. During the readout stage the potentials again are in the spill condition but this time the drain is connected to the readout electronics and the quantity of charge that was generated and stored during the integrate stage may now be measured by the external circuitry. When the full integrated charge has been read out, the cycle then repeats starting with the fill, or reset, stage.

As noted above, the device and/or array is epitaxially grown upon a conductive substrate. Assuming that the substrate is of conductivity type P+, one preferred fabrication method may comprise the following sequence of steps. First, an optional layer of P>λ material is grown. This optional layer contains a shallow acceptor impurity with a concentration adjusted to give strong absorption out to wavelengths in excess of the desired detector maximum wavelength. The P>λ layer need not in itself be a good detector material. It is only there to remove unwanted stray scattered and/or reflected light from re-entering the active detector regions from the rear.

Second, an "instinsic" (i.e., intrinsic or near intrinsic) layer is grown to separate the device from the substrate.

Third, the relatively thick active detector layer is grown with the desired low concentration of N material.

Fourth, the N+ drains and the P+ channel stops are diffused into the active detector layer to define the device or array of devices.

Fifth, the oxide region is grown.

Sixth, the detector gate is grown using a thin layer of conductive transparent material which may be a semiconductor of conductivity type N+ or P+ with its impurity band coalesced with its conduction band or valence band, respectively.

Seventh, depending on the type of external clocking system chosen for the device and/or array, conventional etching, growing and/or plating and implanting techniques are used to produce the other necessary gates and/or overlapping gates and/or two-phase implanted gates, etc., and the feedthrough holes for contacts to the drains and channel stops.

Eighth, regions with unwanted infrared sensitivity are masked off with opaque material such as a dielectric absorber (such as Teflon, polyethylene or Kapton), or an opaque non-conducting semiconductor, or a dielectric underneath an opaque conducting electrode.

All the above steps are compatible with simultaneous construction of "on-chip" MOS electronics for clocking and/or read-out circuits.

DETAILED DESCRIPTION OF A PREFERRED EMBODIMENT

Figure 1:
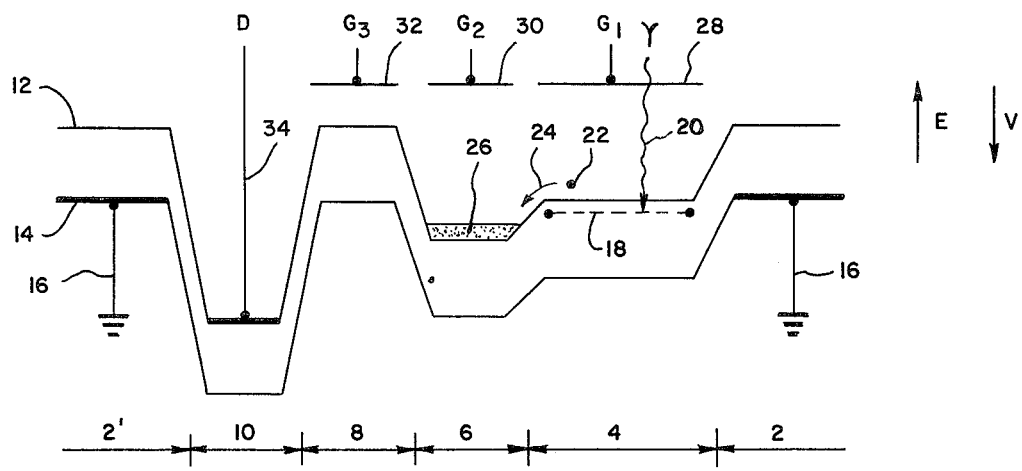
FIG. 1 is an energy band schematic diagram of an extrinsic infrared detector device constructed in accordance with the present invention showing the operation of the device during the integrate stage of the device's operational cycle.

The invention will now be described in detail with particular reference to a presently preferred embodiment thereof so that the average artisan will better be able to make and use the invention, not only with respect to an embodiment such as is illustrated in the drawings but also with respect to such other embodiments as may be desirable or necessary for particular applications.

FIG. 1 is a schematic energy level diagram representation of a single N channel device in accordance with the present invention with its gates and drain at typical potentials such as they would be during the integrate stage of a typical operational cycle. The effective outer boundries of the device are defined by P+ channel stops (2,2'). An active detector region (4) acts as a source of carriers (electrons in the case of an N channel device). Adjoining the detector region (4) is an integrating region (6). A readout gate region (8) is located between the integrating region (6) and a drain region (10) and functions during the integrate stage of the device's operational cycle to electrically isolate the integrating region (6) from the drain region (10).

The conduction band (12) of the host semiconductor is shown as a contour line moving through the device from one channel stop (2) to the other (2'). The energy levels (the arrow E pointing up to the higher energy levels) are drawn for electrons, hence the voltage potentials increase as one moves down on the diagram (as indicated by the arrow V pointing to higher voltage potentials). The valence band (14) of the host semiconductor is shown for reference. The heavy line where the conduction band (12) passes through the drain region (10) symbolizes that the drain is defined by a region of N+ material. The heavy lines where the valence band (14) passes through the channel stops (2,2') symbolize that the stops are P+ material. The channel stops are shown as electrically grounded (16) to provide a fixed reference point for the other voltage potentials present in the device.

The donor impurity band (18) is shown close to the conduction band (12) in the active detector region (4). As mentioned previously, since the impurity band (18) is essentially non-conductive, the impurity band may extend structurally throughout the device area; however the impurity band is only functional as an absorber of photons in the active detector region (4) as shown in the Figure.

When a photon (20) is absorbed by a donor in the impurity band (18), an electron (22) is excited into the conduction band (12). The electron then seeks to move to the lowest energy level available to it. Hence the electron moves (arrow 24) into the integrating region (6) where it is collected. The collected electrons are shown as a shaded region (26) because they actually fill up the available energy levels in the conduction band (12) of the integrating region (6) to a finite depth as is shown schematically in the Figure.

The first gate electrode is a transparent detector gate (28) and is electrically connected to a fixed first gate potential G1. Note that the incoming photon (20) is shown passing through the gate. The detector gate (28) thus functions to establish the voltage potential of the conduction band (12) in the detector region (4). With a nonconducting impurity band it is difficult on theoretical and practical grounds to determine what the voltage potential otherwise would have been. (The Fermi level, which would be at ground potential in the Figure, may be at the impurity band (18), or somewhere between the impurity band (18) and the conduction band (12), or somewhere between the valence band (14) and the conduction band (12), depending on the donor dopant concentration, the residual acceptor impurity concentrations and the operating temperature of the device. See, for instance, Kittel, "Introduction to Solid State Physics", 2nd Ed., Chapter 13 "Semi-conductor Crystals", Wiley, 1956. Hence it is preferable, although theoretically not essential, to provide an externally adjusted gate electrode (28) to determine the potential in the active detector region (4) rather than to trust in achieving a fortuitously acceptable level by adjusting the other above-mentioned parameters).

The second gate electrode is an opaque integrating region gate (30) and is electrically connected to a fixed second gate potential G2.

The third gate electrode is an opaque readout gate (32) which is electrically connected to a variable third gate potential G3. By making these latter two gate electrodes (30,32) with an opaque conductive material, it then becomes feasible to physically extend the donor impurity band (18) throughout the device, which greatly facilitates fabrication of the device by epitaxial growth techniques. However, if the device is fabricated such that the donor impurity band (18) is confined to the active detector region (4), the integrating gate (30) and readout gate (32) would then not necessarily have to be opaque in order to assure the proper operation of the device.

The voltage potentials G1 and G2 applied to the transparent detector gate (28) and the integrate gate (30) respectively may be adjusted for the optimum operation of the device during the integrate stage of operation (FIG. 1) and may be left at the same potentials for the other stages of the operational cycle. On the other hand, the potentials G3 at the readout gate (32) and D at the drain connection (34) will be varied according to the stage of the cycle and also according to the requirements of the X-Y addressing of individual picture elements (pixels) in an array of such devices. (See discussion following with regard to FIG. 6).

Figure 2:
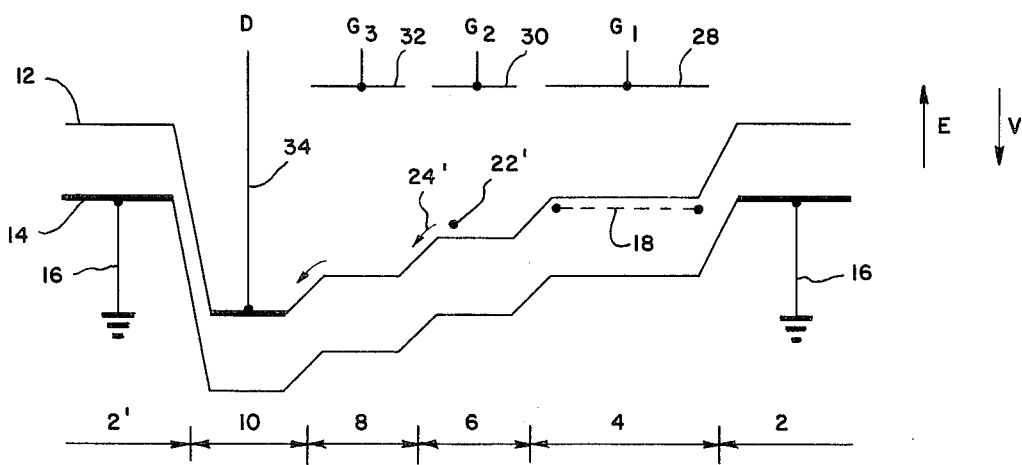
FIG. 2 is an energy band schematic diagram similar to that of FIG. 1 but showing the operation of the device during the readout stage of the cycle.

FIG. 2 is a schematic energy level diagram representation similar to FIG. 1 with the gate and drain potentials (G1, G2, G3, D) at values appropriate for the readout stage operation of the device. The voltage potential G3 on the readout gate (32) has been increased relative to the condition shown in FIG. 1 so that the potential of the conduction band (12) in the readout region (8) lies intermediate between the conduction band potentials in the integrate region (6) and the drain region (10). The previously excited electrons (22') which had been stored (region 26) in the integration region (6) now may flow (arrows 24') through the readout region (8) into the drain region (10), and may exit the device via the drain connection (34) that leads to the external readout electronics (which may be "on chip") wherein the quantity of charge that was generated (electrons 22, FIG. 1) and stored (region 26, FIG. 1) during the integrate state can be measured.

The integrate and readout stages (FIGS. 1 and 2 respectively) cannot be repeated alternately ad infinitum removing negative electrons each time without ultimately creating a substantial positive space charge at the donor sites (18) in the active detector region (4). The positive space charge so generated would eventually become strong enough to prevent the excited electrons (22) from leaving the active detector region (4), and the measured readout would thus eventually drop to zero, thereby rendering the device inoperative. To prevent such an occurrence, the present invention provides for periodic replenishment of the excited electrons lost by the donor sites (18). In particular, there is provided a fill (or "reset") stage, followed by a spill stage wherein excess replenishment electrons are drained off. Preferably this two-stage fill-spill replenishment operation should come after each two-stage integrate-readout operation. However, the device could also be satisfactorily operated with only one fill-spill sequence following after a group of several integrate-readout sequences so long as the space charge buildup does not become excessive.

Figure 3:
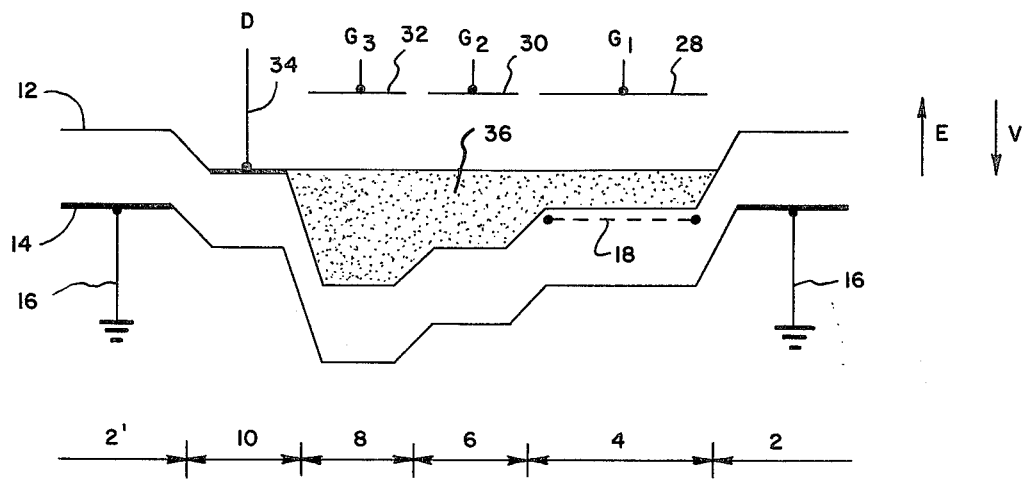
FIG. 3 is a third energy band schematic diagram showing the operation of the device during the fill stage.

FIG. 3 is a schematic energy level diagram representation of the present invention during the fill stage of the device's typical operational cycle. The drain connection (34), is temporarily disconnected from external readout electronics and its potential is lowered until it is less than the potential of the conduction band (12) where the conduction band passes through the active detection region (4). Replenishment electrons from the drain (34) then will fill the energy levels (shaded area 36) in the conduction band (12) at the readout (8), integrate (6) and active detector (4) regions. In the active detector region, the conduction band electrons (36) can now drop into the donor impurity band (18) wherever there is a donor site which has lost an electron due to having absorbed a photon (20). This neutralizes the above-described photo-induced positive space charge, fills the empty donor sites, and "resets" the active detector region (4).

Incoming photons (20) would be difficult to count if the electrons they produced (22, FIG. 1) had to be measured in the presence of a surplus of replenishment electrons (36). Furthermore, the energy of the absorbed photons would have to be from the donor impurity band (18) to the top of the drain electrons (34)—too high for any photons in the infrared portion of the spectrum. Hence, excess replenishment electrons (36) should be drained off be a "spill" stage prior to starting a new stage of collecting electrons excited by infrared photon absorptions.

Figure 4:
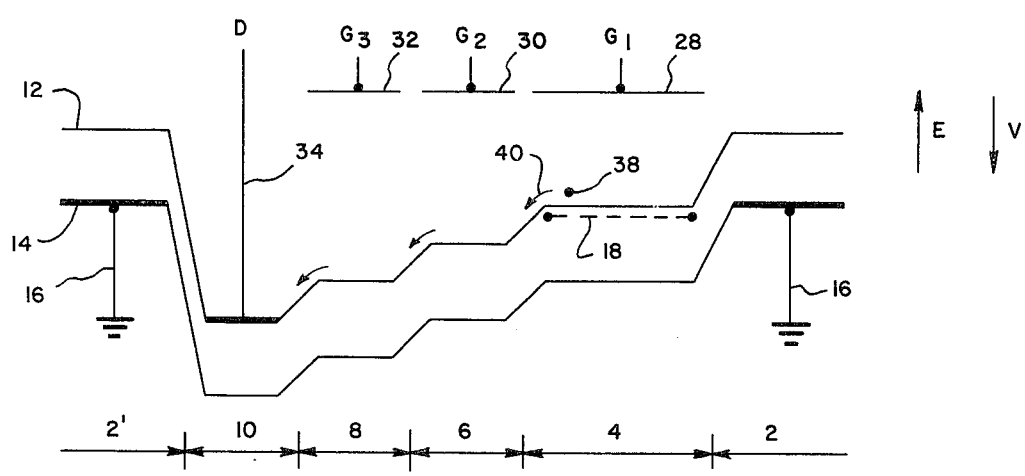
FIG. 4 is a fourth energy band schematic diagram showing the operation of the device during the spill stage.

FIG. 4 is a schematic energy level diagram representation of the operation of the present invention during such a spill stage. The voltage potentials on the drain (34) and the three gates (32, 30, 28) is the same as they were during the readout stage (FIG. 2). However, the surplus electrons (38) are carried off (arrows 40) by the drain connection (34) to an external battery, or some other suitable constant potential (preferably separate from the readout electronics). When the surplus replenishment electrons (38) have had time to be drained off, the device may be reset to operate in its integrate stage (FIG. 1) and a new cycle may thus be started.

Figure 5:
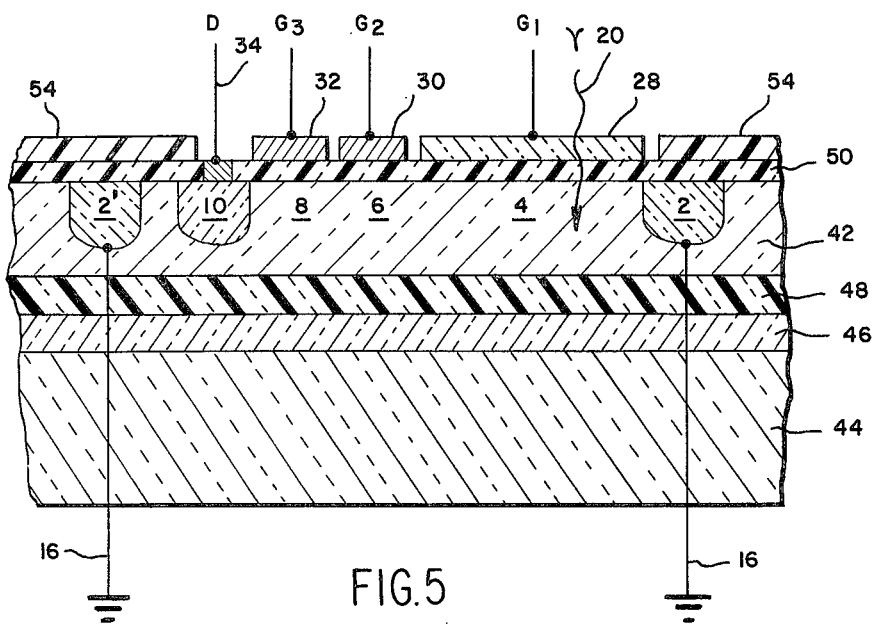
FIG. 5 is a schematic cross section diagram of a part of the device whose operation was shown schematically in FIGS. 1 through 4.

Reference should now be made to FIG. 5 which is a schematic cross section diagram through a single extrinsic infrared detector device such as was described functionally above with particular reference to FIGS. 1 through 4. It will be recalled that the donor impurity band (18) is functional only in the active detector region (4)—that is to say, the area directly below the transparent detector gate (28); however, as a matter of fabrication convenience, the donor impurity layer (42) containing donor impurity band (18) may extend across the entire device or array of detector devices, and FIG. 5 depicts a device so constructed.

It will be seen that the device shown in cross section in FIG. 5 has several other layers below the donor impurity layer (42) all of which are built up epitaxially starting with a conductive P+ substrate layer (44) shown at the bottom of the Figure. (Since the bottom substrate layer (44) is the layer of the device furthest from the incoming photons (20), it defines the "rear" of the device, and the various gates including the detector gate (28), the integrating gate (30) and the readout gate (32) define the "front" surface of the device). Immediately above the substrate layer (44) there is provided an optional P>λ (P greater than lambda) absorbing layer (46). It will be recalled that at the lower dopant concentrations normally associated with very small impurity bandages such as are required in a detector for use in the far infrared, a relatively thick detector region is required in order to maintain the quantum efficiency η at a relatively high level and thus any photons which do pass through the active detector area without being absorbed at a dopant site may be reflected back by the rear surface of the substrate with a resultant degradation of the detector's optical resolution. The P>λ absorbing layer thus functions as a means for absorbing photons that pass through one active detector area before they can be reflected into an adjacent detector area. The operative components of the actual device are separated from the substrate (44) and the optional absorbing layer (46) by an intrinsic semiconductor (or neary intrinsic) layer (48) which is grown epitaxially upon the preceding layer below. The purpose of the P+ substrate (44) is to act as a channel stop at the rear of the device so as to keep the N channel electrons in their proper near-the-surface position below the gates (32), (30) and (28) and to maintain the effectiveness of the P+ channel stops (2,2') even under the cryogenic conditions at which the device will be operated. If it were not for the P+ substrate (44), the depletion region at cryogenic temperatures would extend with a virtually linear potential gradient from the top of the donor impurity level (42) (i.e., at the interface with the oxide) to the back of the substrate (i.e., at the electrical ground connection). The optional P>λ layer (46) as grown is connected electrically to the P+ substrate (44). Thus, the intrinsic layer (48) is provided to insure that the P+ substrate and/or the P>λ layer does not make a sharp transition to the N-type donor impurity layer (42) which might otherwise result in the creation of a tunnel diode or some other unwanted junction effect.

The donor impurity layer (42) is then grown epitaxially on the intrinsic layer (48). As discussed previously, the low concentration donor impurity band (18) extends uniformly across the whole of the donor impurity layer (42) and thus it is created at the same step of the fabrication process as creates the physical donor impurity layer (42) with no substrate ion implantation or dopant diffusion being required.

Figure 6:
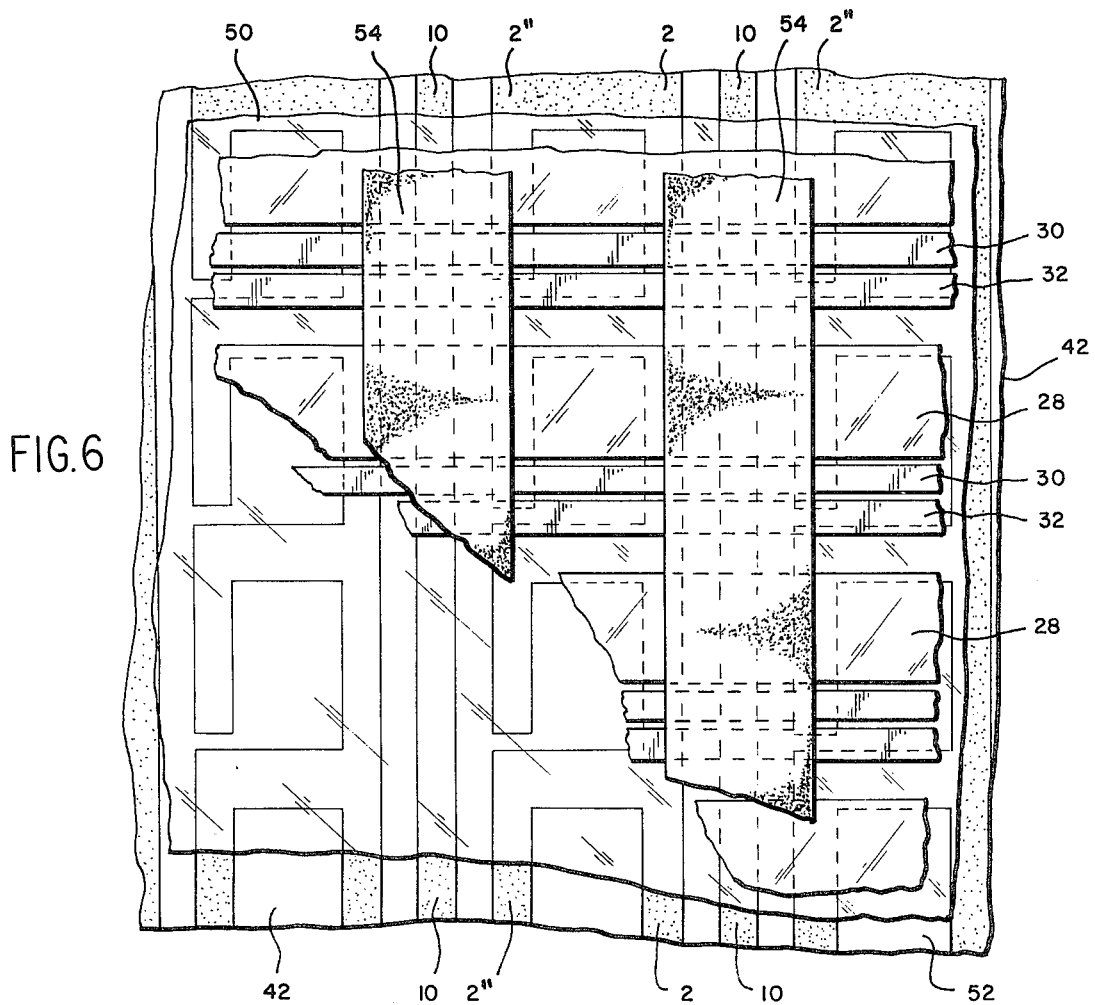
FIG. 6 is a top plan view of a portion of an array of detectors constructed in accordance with the present invention.

In accordance with typical MOS technology fabrication procedures, the P+ channel stops (2, 2') and the drain (10) may then be diffused into the donor impurity layer (42). An oxide layer (50) is then grown across the entire device. The transparent detector gate (28) is then formed by growing a thin layer of conductive transparent semiconductor material of either conductivity type, N+ or P+, with its impurity band coalesced with its conduction band or valence band, respectively. The unwanted portions of the transparent detector gate (28) are then etched away. Reference should also be made to FIG. 6 which shows one preferred two-dimensional configuration for the various elements in plan view. A second etching step results in a hole (52) in the oxide (50) through which a drain connection (34) is made to the drain (10). Conductive electrodes for the opaque integration gate (30) and the opaque readout gate (32) are laid down upon the oxide layer (50). These latter two gates define the integrating region (6) and the readout region (8) respectively which are also regions within the donor impurity level (42). Finally, an opaque mask (54) is laid down over areas of potentially unwanted sensitivity (see also FIG. 6). Photons (20) can thus enter the donor impurity layer (42) only through the transparent detector gate (28) above the active detector region (4).

It should be understood that although a particular fabrication scenario has been described, any other fabrication process which results in the desired configuration may be substituted. Thus, rather than growing the active detector area epitaxially, the required low concentration of donor sites may be formed in an intrinsic semiconductor layer by means of diffusion, ion implantation, or the like, in which case there will be no requirement to provide an opaque mask (48). The integrating gate electrode (30) and the readout gate electrode (32) could also be made of the same transparent conductive material as forms the detector gate (28), since in this alternate construction only the active detector region (4) would be sensitive to incoming photons (20).

Reference should now be made specifically to FIG. 6 which is a top plan view of a portion of an array of devices constructed in accordance with one preferred embodiment of the present invention. In particular, from this Figure it can be seen how a plurality of individual infrared detector devices such as have been discussed previously with respect to FIGS. 1 through 5 can be fabricated as a two-dimensional monolithic array of X-Y addressable picture elements such as may be used in an infrared camera or other suitable imaging application.

Each individual active detector area (4) is approximately square in shape bounded on one side by the opaque integrating electrode (30) and on the other three sides by the P+ channel stops (2, 2″). The channel stops are oriented as columns (2) extending in the Y direction of the array with each column containing a plurality of extension arms (2″) each in the shape of a hook extending to the left and then down from the vertical column from which it depends, with one such extension being provided for each individual detector area ("picture element"). The transparent gate electrode (28) overlaying the active detector areas (4) may assume the form of one or more strips, each extending horizontally across the array in the X-direction. The above-mentioned opaque integrating gates (30) also may be in the form of strips extending in the X-direction, each such integrating gate strip being immediately adjacent to a transparent detector gate strip (28). A second opaque gate strip is provided immediately below each integrating gate strip (30), namely the readout gate strips (32) which may also be oriented in the X-direction of the array.

The N+ drain columns (10) extend in the Y-direction of the array in the region separating one channel stop column (2) from the next. It should be noted that functionally a particular drain column (10) is associated only with the detector area to its immediate right where a small opening is provided from within the ring formed by the P+ channel stop hook-shaped extension arm (2″) so that a slot is defined through which electrons may flow from the active detector region (4) to the associated drain (10).

The regions of the donor impurity layer (42) lying between the P+ channel stops (2, 2″) and the drain channels (10) which might be sensitive to incoming photons are overlaid with opaque masking strips (54). As shown in the Figure, the masking strips (54) are laid directly on top of the transparent gate electrodes (28) and the conductive gate electrodes (30 and 32). Accordingly, the opaque masks (54) should be formed from a nonconductive material. Alternatively, the entire device could be covered with a transparent layer of insulating material prior to applying the opaque masking strips which could then be formed from a conductive material.

Each individual picture element comprises an active detector region (4) surrounded by an integrating gate (30), a vertical portion of the channel stop (2) and an associated channel stop arm (2″) thus forming a "bucket" in which to collect the electrons (26). The associated readout gate electrode (32) covers the slot at the end of the channel stop arm (2″) at the lower left-hand corner of each individual picture element. During the readout and the spill stages of the operational cycle, electrons (22, 38) thus may flow thorugh this slot on the way to the drain channel (10). Where the electrons pass through the region between the channel stop slot and the drain region (10), they are prevented from straying in the Y-direction by the integrating gate strip (30) on one side and on the other side by the detector gate strip (28) of the adjacent picture elements.

When a particular row of the array is in the readout stage of the operational cycle by virtue of an appropriate potential being applied to the readout gate electrode strip (32) associated with that row (see also FIG. 2), only the individual detectors in that row which also have their associated drain columns (10) connected to the array readout electronics (now shown) will actually have their charges measured. Thus, in addition to individual X-Y addressing, line-at-a-time addressing is also possible. If, for instance, during the readout stage, each drain channel was connected to the control gate of a charge injection input into, say, every fourth bucket of a four-phase CCD oriented in the X-direction, then line-at-a-time on-chip multiplexing could readily be achieved.

The embodiment described in detail above and illustrated in the Figures is particularly adapted for a sequential readout mode of operation in which most of the detectors may be operating in the integrating stage while only a few detectors are operating in the readout, fill and/or spill stages. This is particularly advantageous for a large X-Y array of such devices that is being used to view a weakly illuminated scene since those devices in the array that are not being addressed by the application of the appropriate readout gate electrodes (32) will continue to operate in the integrating mode (FIG. 1) and thus will still be absorbing incoming photons (20).

It may also be possible to construct a relatively simplified extrinsic detector which might have particular merit of its own. In this simplified version, the device is operated in a continuous readout mode of operation without any provision for a separate integrating stage. Therefore, the integration region (6) and the opaque integration gate (30) may be omitted. Furthermore, since such simplified devices are read out continuously, each device will normally have an associated readout circuit not time-shared with other devices in the Y-direction. Therefore, the readout gate region (8) and the opaque readout gate (32) may also be omitted, thus further simplifying the design of such a simplified version.

The operation cycle of such a simplified version is with only two stages; a readout stage (analogous to FIG. 1) and a fill or reset stage (analogous to FIG. 3). In the readout stage, incoming photons (20) are absorbed in the donor impurity band (18) thus exciting electrons (22) into the conduction band (12) as was shown in FIG. 1. The electrons (24) are continuously read out by measuring the current flow into the drain (34) (rather than measuring the accumulated charge) as was shown in FIG. 2. It should be understood that the integration region (6), readout gate region (8), integration gate (30) and readout gate (32) are not necessary for continuous readout since the current generated by the detector will flow directly into an external readout circuit.

The fill or reset stage is accomplished as was shown in FIG. 3, but again without the integration region (6), readout region (8), integration gate (3) and readout gate (32). The spill stage may be omitted entirely. Its function is accomplished by merely ignoring the initial burst of current at the start of each readout stage, said initial current being caused by the draining off of the excess replenishment electrons (36) from the reset stage.

Note that in the design of this simplified version, the primary function of the remaining gate, which is the transparent detector gate (28) is to maintain the potential within the active detector region (4) at an appropriate level with respect to the drain potential D. The transparent detector gate (28) could thus also be omitted in the event that the background photon flux incident on the device is high enough that the Fermi level becomes clearly defined at the donor impurity band level (18) within the time it takes for the initial burst of excess replenishment electrons to pass at the start of each readout stage.

A plurality of such simplified detectors could be fabricated as a monolithic linear array analagous to a single row of the devices shown in FIG. 6, but without the readout gates (32) or the integration gates (30). Such an array of devices could possibly find particular utility in the manufacture of linear scanned arrays for use where a high level of background light flux makes staring mosaic arrays impractical.

The foregoing descriptions assume an N-type device built on a P-type substrate. Obviously a complementary P-type device built on an N-type substrate is also possible and is intended to be included as an obvious alternative embodiment. Similarly, only simple side-by-side gates have been shown, but the obvious optional use of overlapping gates, two-phase implanted gates or such other gate structures as may be convenient to the choice of external clocking systems should also be deemed to be included herein, even though not discussed in detail.

It should also be obvious that other array geometries are possible in which the shapes, proportions, and relative locations of the various elements may be different from those discussed and illustrated herein. For example, the size of the active detector area (4) could be increased relative to the size of the other elements thus increasing the active detector area coverage measured as a percentage of the area of the complete device element. As an additional example, for certain applications it may be desirable to stagger the detector areas from one row to the next so that the rows do not intersect the columns at right angles. Many other variations will doubtless occur to the skilled artisan.

Accordingly, the scope of the present invention should not be deemed as limited by any particular aspect of the particular embodiments described and illustrated herein, but rather only by the broad scope of the appended claims in which the literal significance of various recited particular elements is to be construed as extending to encompass the various equivalents thereof including but not limited to those equivalents and alternative embodiments briefly discussed above.

What is claimed is:

1. An extrinsic photon detector device comprising:
   a semiconductor substrate of a first conductivity type;
   a first layer of semiconductor material of a second conductivity type above said substrate;
   drain means defined within said first layer of semiconductor material of said second conductivity type,
   an active device region defined within said first layer of semiconductor material, said active device region comprising a detector portion and an integrating portion;
   impurities of said second conductivity type extending throughout said detector portion for absorbing photons having predetermined wavelength characteristics in the infrared;
   a first gate electrode above said detector portion of said active device region and separated therefrom by a dielectric material;
   a second gate electrode above said integrating portion of said active device region and separated therefrom by a dielectric material, said second gate electrode being adjacent to said first gate electrode;
   a third region defined within said first layer of semiconductor material and located between said active device region and said drain means;
   third gate means associated with said third region for altering the potential of at least a portion of said third region relative to said substrate in response to an externally applied voltage potential;
   means for varying the voltage potentials applied to said first gate electrode, to said second gate electrode, to said third gate means, and to said drain means relative to that of said substrate to cause carriers resulting from the absorption of photons in said detector portion to be collected in said integrating portion during an integrating stage of operation of said detector device and then to be transferred to said drain means via said third region during a readout stage of operation, and also to cause replenishment carriers from said drain means to flow via said third region into said active device region during a fill stage of operation and to neutralize any photo-induced space charge in said active device region resulting from said integrating and read-out stages and any excess of said replenishment carriers to be drained off during a spill stage of operation, said fill and spill stages together constituting a charge reset function to facilitate a subsequent said integrating stage.

2. The device of claim 1 wherein the concentration of said photon-absorbing impurities within said detector portion is sufficiently low so as to make the impurity band within said detector portion essentially non-conductive.

3. The device of claim 2 wherein said detector portion is sufficiently thick relative to said low concentration of said impurities so as to render said detector portion effectively opaque to said infrared photons.

4. The device of claim, 2 wherein said photon-absorbing impurities extend across the entirety of said first layer of semiconductor material.

5. The device of claim 1 wherein said first gate electrode is transparent and said device further comprises a second layer of semiconductor material, said second layer being of said first conductivity type, said second layer being between said first layer and said substrate, said second layer being capable of absorbing essentially all photons having said predetermined wavelength characteristics which may pass through the entire thickness of said detector portion, said second layer being more opaque to said photons than said substrate.

6. The device of claim 5 further comprising a third layer of semiconductor material, said third layer being of an essentially intrinsic conductivity type, said third layer being between said second layer and said first layer, whereby junction effects between said second layer and said first layer are avoided.

7. The device of claim 1 further comprising a second layer of semiconductor material, said second layer being of essentially intrinsic conductivity type, said second layer being between said first layer and said substrate, whereby junction effects between said substrate and said first layer are avoided.

8. The device of claim 7 wherein said first layer including said impurities is grown epitaxially.

9. The device of claim 1 wherein said drain means is a drain line constructed within said first layer.

10. The device of claim 9 further comprising a channel stop constructed within said first layer, said channel stop and said third region together defining the boundary of said active device region.

11. A monolithic array comprising a plurality of devices as recited in claim 10 wherein said drain line and said channel stop are each common to a first said device and a second said device within said array.

12. A monolithic array comprising a plurality of devices as recited in claim 10 wherein said third gate means comprises a third gate electrode and wherein said first gate electrode, said second gate electrode and said third gate electrode are common to a first said device and a second said device within said array.

13. A monolithic array comprising a plurality of devices as recited in claim 12 wherein said array is a two-dimensional array having an X-direction wherein said first gate electrode, said second gate electrode and said third gate electrode each extend from said first device to said second device along said X-direction and having a Y-direction wherein said drain line and said channel stop each extend from said first device to a third said device within said array along said Y-direction.

14. The monolithic array of claims 11 or 12 or 13 further comprising an on-chip clocking, addressing and readout cicuit for reading out data from a particular one of said plurality of devices.

15. The monolithic array of claims 12 or 13 further comprising on-chip charge-coupled-device circuitry for simultaneously reading data during said readout stage of operation from said first and second devices.

* * * * *